US010884043B1

(12) United States Patent
Couleur et al.

(10) Patent No.: US 10,884,043 B1
(45) Date of Patent: Jan. 5, 2021

(54) POWER CONVERTER WITH PHASE ERROR CORRECTION

(71) Applicant: Apple Inc., Cupertino, CA (US)

(72) Inventors: Michael Couleur, Rottach-Egern (DE); Andrea Acquas, Munich (DE); Nikola Jovanovic, Unterschlessheim (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/517,402

(22) Filed: Jul. 19, 2019

(51) Int. Cl.
  *G01R 25/00* (2006.01)
  *H03K 5/135* (2006.01)
  *G06F 1/04* (2006.01)
  *H03K 4/90* (2006.01)

(52) U.S. Cl.
  CPC .......... *G01R 25/005* (2013.01); *H03K 5/135* (2013.01); *G06F 1/04* (2013.01); *H03K 4/90* (2013.01)

(58) Field of Classification Search
  CPC ........ G01R 25/005; H03K 5/135; H03K 4/90; G06F 1/04
  See application file for complete search history.

(56) References Cited

U.S. PATENT DOCUMENTS

| 8,446,137 | B2 | 5/2013 | Mariani et al. | |
| 8,829,876 | B2* | 9/2014 | Michishita | H02M 3/158 323/284 |
| 9,252,757 | B2 | 2/2016 | Chao et al. | |
| 9,450,487 | B2 | 9/2016 | Hari et al. | |

* cited by examiner

*Primary Examiner* — Jung Kim
(74) *Attorney, Agent, or Firm* — Kowert, Hood, Munyon, Rankin & Goetzel, P.C.

(57) ABSTRACT

A power converter circuit included in a computer system may charge and discharge a switch node coupled to a regulated power supply node via an inductor. The power converter circuit may generate a reference clock signal using a system clock signal and a voltage level of the switch node. The reference clock signal may be used to initiate a charge cycle, whose duration may be based on generated ramp signals.

17 Claims, 11 Drawing Sheets

POWER CONVERTER WITH PHASE ERROR CORRECTION

BACKGROUND

Technical Field

Embodiments described herein relate to integrated circuits, and more particularly, to techniques for generating regulated power supply voltages.

Description of the Related Art

Modern computer systems may include multiple circuit blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power converter circuits configured to generate regulator voltage levels on respective power supply signals using a voltage level of an input power supply signal. Such regulator circuits may employ multiple passive circuit elements, such as inductors, capacitors, and the like.

SUMMARY OF THE EMBODIMENTS

Various embodiments for generating a regulated power supply voltage level are disclosed. Broadly speaking, a voltage regulator circuit, that includes a switch node coupled to a regulated power supply node via an inductor, may be configured to source current to the switch node during a charge cycle. A control circuit may be configured to generate a reference clock signal using a system clock signal and a voltage level of the switch node. The control circuit may be further configured to initiate the charge cycle using the reference clock signal and halt the charge cycle using generated ramp signals. In other non-limiting embodiments, the control circuit may be further configured to determine a phase difference between the system clock signal and the voltage level of the switch node. In some embodiments, the control circuit may be further configured, based on the phase difference, to selectively charge or discharge a capacitor.

BRIEF DESCRIPTION OF THE DRAWINGS

The following detailed description makes reference to the accompanying drawings, which are now briefly described.

Figure 1:
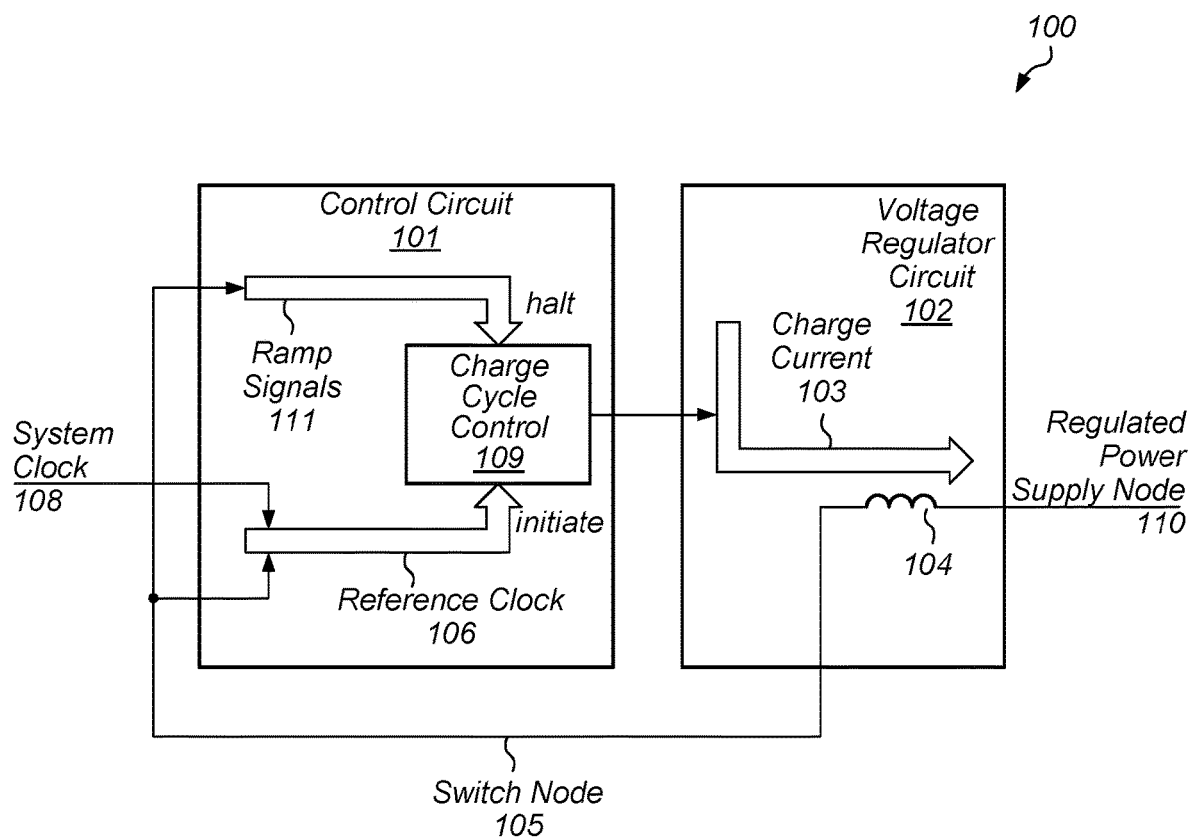
FIG. 1 is a block diagram of an embodiment of a power converter circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple power converter circuits configured to generate regulated voltage levels for various power supply signals. Such power converter circuits may employ regulator circuits that include both passive circuit elements (e.g., inductors, capacitors, etc.) as well as active circuit elements (e.g., transistors, diodes, etc.).

Different types of voltage regulator circuits may be employed based on power requirements of load circuits, available circuit area, and the like. One type of commonly used voltage regulator circuit is a buck converter circuit. Such converter circuits include multiple devices and a switch node that is coupled to a regulated power supply node via an inductor. Particular devices are then activated to periodically charge and discharge the switch node in order to maintain a desired voltage level on power supply node.

When multiple power converter circuits are used in a computer system, noise generated by one power converter circuit may affect the operation of another power converter circuit. To avoid this, a phase difference may be introduced between the various power converter circuits so that they are not operating at the same time.

To enforce such phase differences between the power converter circuits, various phase control techniques may be employed. For example, different clock signals may be used for each converter, or phase-locked loop style circuits may be employed. Clocked systems, however, may have poor performance during changes in current demanded by a load, and high-gain phase-locked loop circuits may have stability issues. In some cases, low-gain phase-locked loop circuits may be employed to address the stability issues. Such low-gain phase-locked loop circuits may, however, result in insufficient phase error correction such that one or more power converter circuits to operate at the time.

The embodiments illustrated in the drawings and described below may provide techniques for operating a power converter circuit using a combination of a high-gain control loop and a low-gain control loop to provide phase control between power converter circuits, while reducing phase error resulting from the low-gain control loop.

A block diagram depicting an embodiment of a power converter circuit is illustrated in FIG. 1. As illustrated, power converter circuit 100 includes control circuit 101 and voltage regulator circuit 102.

Voltage regulator circuit 102 includes switch node 105 coupled to regulated power supply node 110 via inductor 104. In various embodiments, voltage regulator circuit 102 is configured, in response to an initiation of a charge cycle by charge cycle control 109, to charge switch node 105 using an input power supply node. It is noted that although a single voltage regulator circuit is depicted in the embodiment of FIG. 1, in other embodiments, multiple voltage regulator circuits with corresponding sense circuits (collectively "phase units" or "phase circuits") may be coupled to regulated power supply node 110 and operated with different timings (or "phases").

Control circuit 101 is configured to generate reference clock signal 106 using system clock 108 and a voltage level of switch node 105. As used herein, a system clock signal (e.g., system clock 108) refers to a periodic signal used by multiple circuit blocks within a computer system as a timing reference. As described below in more detail, reference clock signal 106 may be generated using a delay-locked loop circuit that employs a phase difference between system clock 108 and transitions in the voltage level of switch node 105 to adjust an amount of time that system clock 108 is delayed in order to generate reference clock signal 106.

Additionally, control circuit 101 is configured to generate ramp signals 111 using the voltage level of switch node 105. As described below in more detail, control circuit 101 may be configured to create falling and rising ramp signals included in ramp signals 111 that mimic or track the behavior (e.g., the ramp signals have similar rise and fall times to that of switch node 105) of circuit nodes within voltage regulator circuit 102. In some embodiments, control circuit 101 may use a combination of capacitors and current sources to generate ramp signals 111.

Control circuit 101 may be further configured, to use charge cycle control 109, and reference clock signal 106, to initiate a charge cycle. By initiating the charge cycle using reference clock signal 106, instead of system clock 108, any phase difference between the operation of power converter circuit 100 and system clock 108 can be reduced to ensure proper phase alignment between other power converter circuits. Since the generation of reference clock signal 106 is performed using a delay-locked loop style circuit, stability issues with the control loop of power converter circuit 100 may be minimized due to the single pole nature of delay-locked loops.

Control circuit 101 is also configured, using charge cycle control 109 and ramp signals 111, to halt the charge cycle. As described below in more detail, control circuit 101 may determine a duration of a charge cycle using ramp signals 111. It is noted that although control circuit 101 is configured to initiate and halt a charge cycle in the present embodiments, in other embodiments, control circuit 101 may be configured to initiate a discharge cycle using reference clock signal 106, and halt the discharge cycle using ramp signals 111.

As described below in more detail, control circuit 101 may include voltage generator circuits and ramp generator circuits. Additionally, control circuit 101 may include comparator circuits, as well as state machines or other sequential logic circuits.

Figure 2:
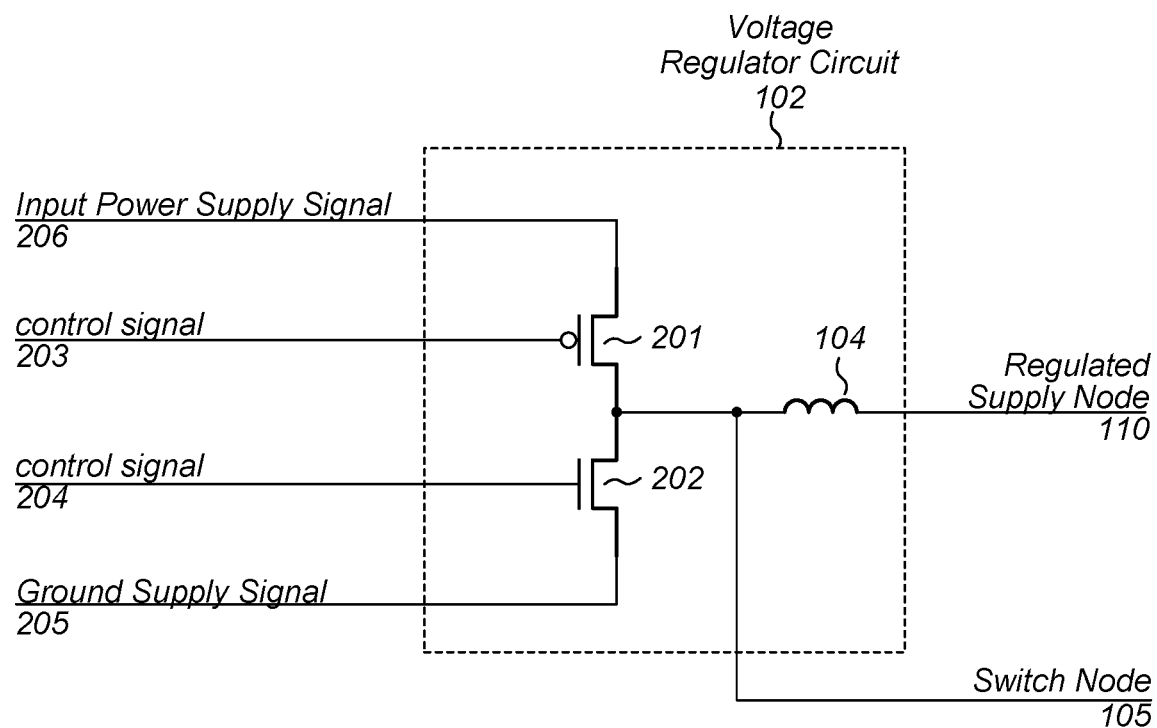
FIG. 2 is a block diagram of an embodiment of a voltage regulator circuit.

A schematic diagram of voltage regulator circuit 102 is depicted in FIG. 2. As illustrated, voltage regulator circuit 102 includes devices 201 and 202, which are both coupled to switch node 105, and controlled by control signals 203 and 204, respectively.

In various embodiments, control circuit 101 may generate control signals 203 and 204. Each of control signals 203 and 204 is used to activate a corresponding one of devices 201 and 202 during charge and discharge cycles. During a charge cycle, current is sourced from input power supply node 206 to regulated power supply node 110, and during a discharge cycle, current is sunk from regulated power supply node 110 into ground supply node 205. Alternating between charge and discharge cycles, and adjusting the duration of either of the charge or discharge cycles may maintain a desired voltage level maintained on regulated power supply node 110.

Device 201 is coupled between input power supply node 206 and switch node 105, and is controlled by control signal 203. During a charge cycle, control signal 203 is asserted, which activates device 201 and couples input power supply signal 206 to switch node 105, thereby charging switch node 105 by allowing a current to flow from input power supply signal 206 to switch node 105, and then onto regulated power supply node 110. As used herein, asserting, or an assertion of, a signal refers to setting the signal to a particular voltage level that activates a circuit or device coupled to the signal. The particular voltage level may be any suitable value. For example, in the case where device 201 is p-channel metal-oxide semiconductor field-effect transistors (MOSFET), control signal 203 may be set to a voltage at or near ground potential.

Device 202 is coupled between switch node 105 and ground supply node 205, and is controlled by control signal 204. During a discharge cycle, control signal 204 is asserted, which activates device 202 and couples switch node 105 to ground supply node 205, thereby providing a conduction path from regulated power supply node 110 through inductor 104 into ground supply node 205. While device 202 is active, current flows from regulated power supply node 110 into ground supply node 205, decreasing the voltage level of regulated power supply node 110. As described below in more detail, the duration of the charge cycle may be based on a comparison of respective voltage levels of ramp signals 111.

Device 201 and device 202 may be particular embodiments of MOSFETs. In particular, device 201 may be a particular embodiment of a p-channel MOSFET and device 202 may be a particular embodiment of an n-channel MOSFET. Although only two devices are depicted in the embodiment of FIG. 2, in other embodiments, any suitable number of devices, coupled in series or parallel, may be employed to achieve particular electrical characteristics (e.g., on-resistance of the devices).

Figure 3:
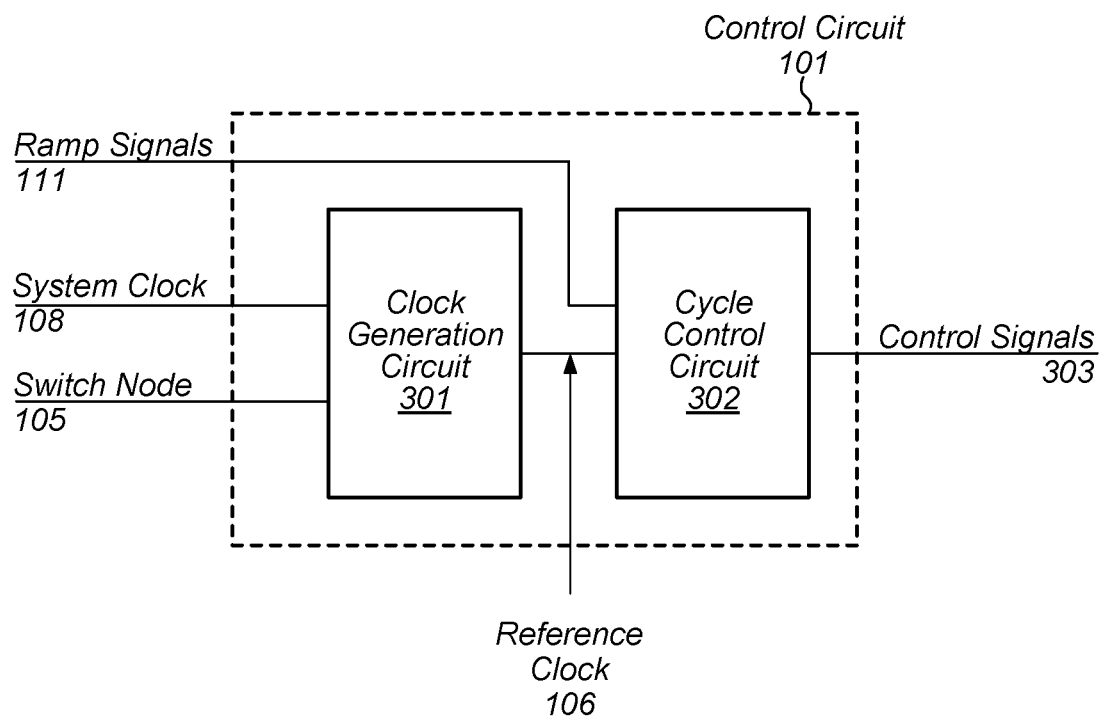
FIG. 3 is a block diagram of a control circuit used in a power converter circuit.

A block diagram of an embodiment of control circuit 101 is illustrated in FIG. 3. As illustrated, control circuit 101 includes clock generation circuit 301 and cycle control circuit 302.

As described below in more detail, clock generation circuit 301 is configured to generate reference clock signal 106 using system clock 108 and a voltage level of switch node 105. In various embodiments, clock generation circuit 301 may include a delay-locked loop, or other similar circuit, configured to generate a delayed version of system clock 108 using results of a comparison of relative phases of system clock 108 and the voltage level of switch node 105. In various embodiments, the delayed version of system clock 108 may correspond to reference clock signal 106.

Cycle control circuit 302 is configured to generate control signals 303 using reference clock signal 106 and ramp signals 111. In various embodiments, control signals 303 may include control signals 203 and 204 as depicted in FIG. 2. The logic values of control signals 303 may change as charge cycle control 109 (e.g., as shown in FIG. 1) initiates and halts a charge cycle. As described below in more detail, cycle control circuit 302 may be configured to modify a sensed inductor current to generate a modified current, and compare the modified current to one or more of ramp signals 111 to determine a duration of the charge cycle.

It is noted that although control circuit 101 is depicted as including two circuit blocks, in other embodiments, additional circuit blocks, both analog and digital may be included. For example, in some cases, control circuit 101 may include reference generator and biasing circuits, current mirror circuits, as well as combinatorial and sequential logic circuits.

Figure 4:
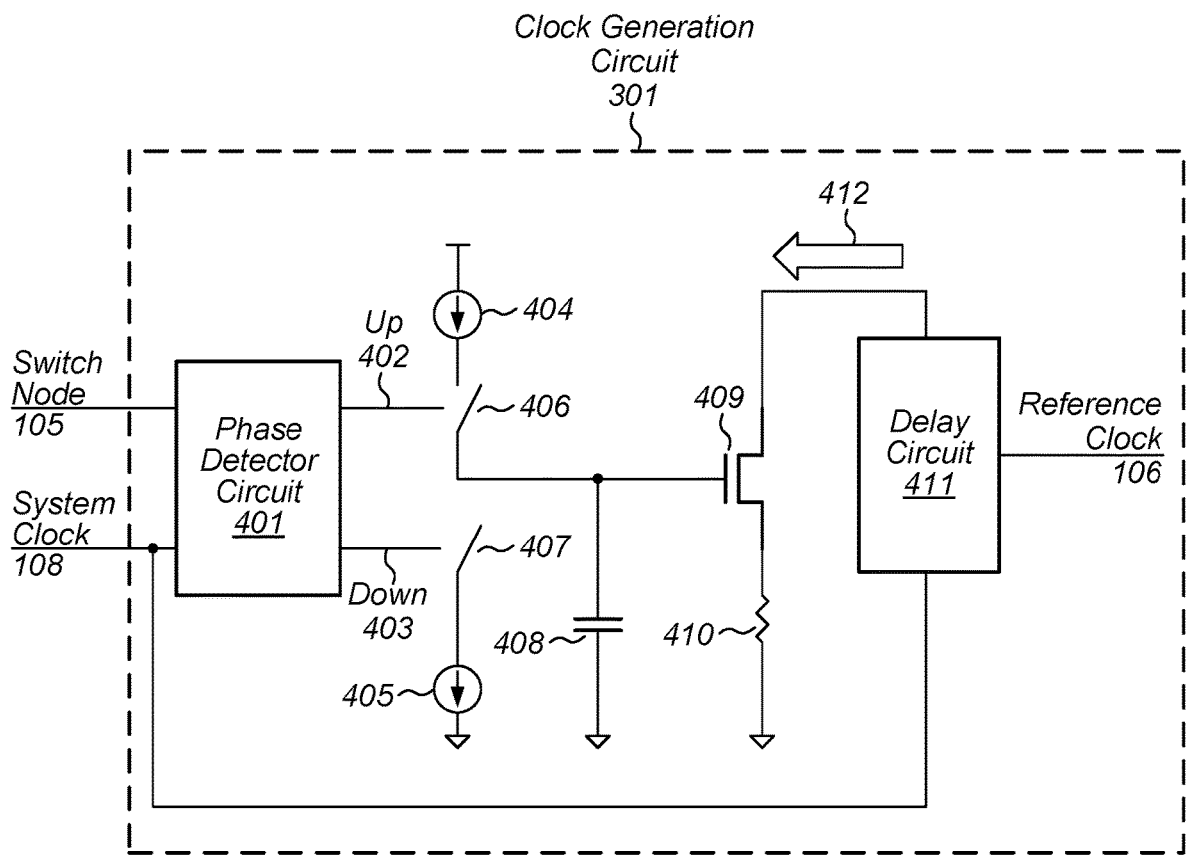
FIG. 4 is a block diagram of an embodiment of a clock generation circuit.

As noted above, clock generation circuit 301 may employ various circuit topologies, including a delay-locked loop circuit, to generate reference clock signal 106. A particular embodiment of a circuit topology for clock generation circuit 301 is depicted in FIG. 4. As illustrated, clock generation circuit 301 includes phase detector circuit 401, current sources 404 and 405, switches 406 and 407, capacitor 408, device 409, resistor 410, and delay circuit 411.

Phase detector circuit 401 is coupled to switch node 105 and system clock 108. In various embodiments, phase detector circuit 401 is configured to generate signals up 402 and down 403 using the relative phases of system clock 108 and the voltage level of switch node 105. For example, if transitions of system clock 108 lead changes in the voltage level of switch node 105, then phase detector circuit 401 may activate signal down 403. Alternatively, if the changes in the voltage level of switch node 105 lead the transitions of system clock 108, then phase detector circuit 401 may activate signal up 402. It is noted that, in some embodiments, phase detector circuit 401 may include circuits (e.g., phase-frequency detector circuits) configured to compare both the phase and frequencies of system clock 108 and the voltage level of switch node 105.

Switches 406 and 407 are configured to selectively couple capacitor 408 to either current source 404 or current source 405 based on the values of signals up 402 and down 403. Using switches 406 and 407, clock generation circuit 301 is configured to selectively charge or discharge capacitor 408 using current sources 404 and 405. In various embodiments, switches 406 and 407 may be implemented using MOSFETs or other suitable switching devices.

Current sources 404 and 405 may be particular embodiments of devices configured to source or sink, respectively, current from capacitor 408 based on a state of switches 406 and 407. In some cases, current source 404 may include a p-channel MOSFET and current source 405 may include an n-channel MOSFET. The control terminals of the devices may, in some embodiments, be coupled to respective nodes at respective bias voltage levels. In various embodiments, the devices may be coupled to one or more current mirror or other suitable circuits.

Capacitor 408 may be a particular embodiment of a metal-oxide-metal (MOM) capacitor structure fabricated using a semiconductor manufacturing process. In some cases, a value of capacitor 408 may be selected based on a desired bandwidth of the control loop formed using the system clock and the voltage level of switch node 105.

To convert a voltage level across capacitor 408 to current 412, clock generator circuit 301 employs device 409 and resistor 410. The control terminal of device 409 is coupled to capacitor 408. Device 409 may be a particular embodiment of an n-channel MOSFET and may be configured to conduct current 412 into resistor 410. A value of current 412 may be based, at least in part, on the voltage level across capacitor 408. In various embodiments, resistor 410 may be may be constructed using metal, polysilicon, or any other suitable material available on a semiconductor manufacturing process.

Delay circuit 411 is configured to generate a delayed version of system clock 108 to generate reference clock signal 106. In various embodiments, an amount of delay between system clock 108 and the delayed version of system clock 108 may be based, at least in part, on a value of current 412. For example, a first value of current 412 may result in delay circuit 411 delaying system clock 108 by a first time period, and a second, larger value of current 412 may result in delay circuit 411 delaying system clock 108 by a second time period larger than the first time period.

Figure 5:
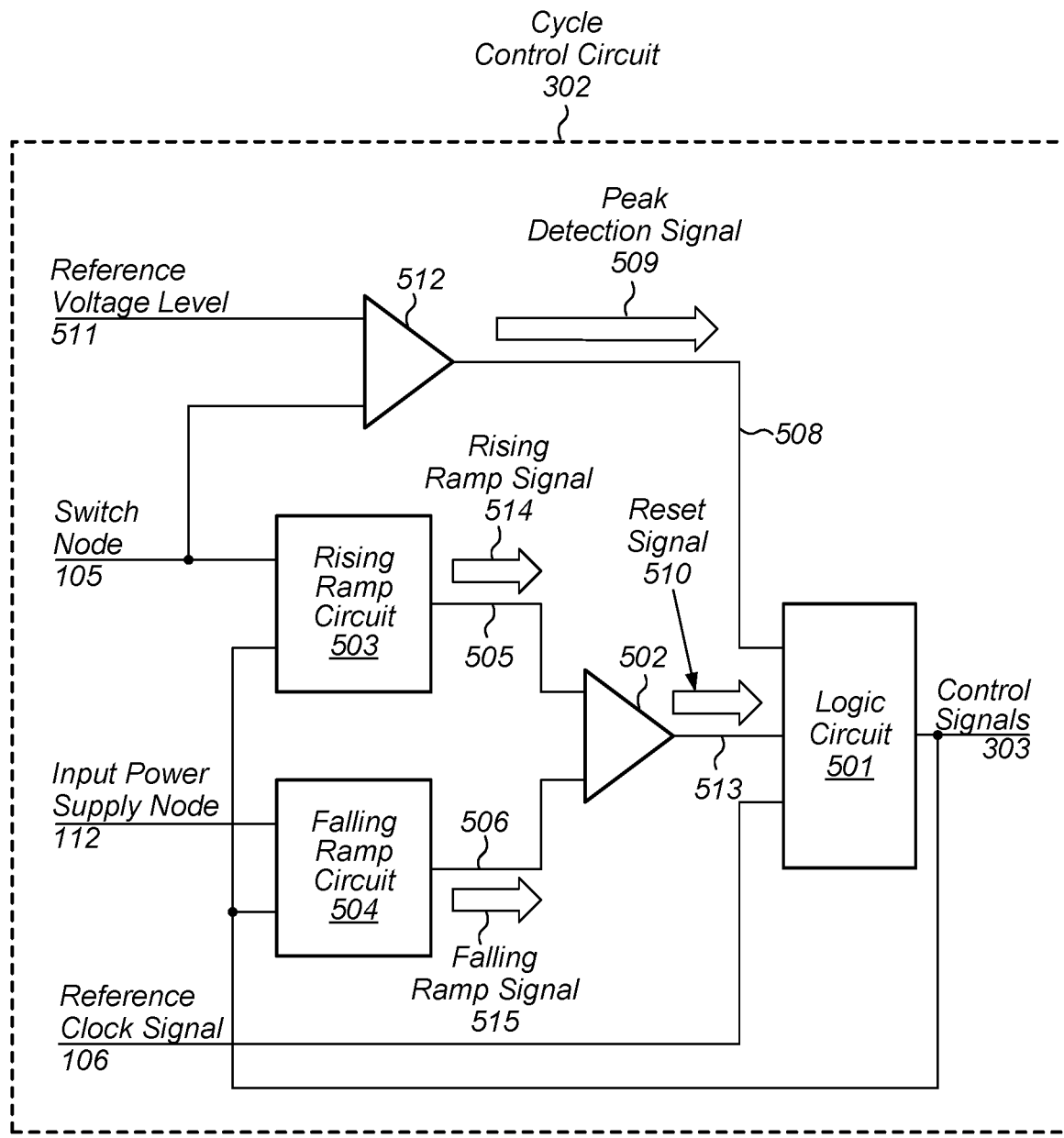
FIG. 5 is a block diagram of an embodiment of a cycle control circuit.

A block diagram of an embodiment of cycle control circuit 302 is depicted in FIG. 5. As illustrated, cycle control circuit 302 includes logic circuit 501, comparator circuit 502, rising ramp circuit 503, falling ramp circuit 504, and comparator circuit 512.

Comparator circuit 512 is coupled to reference voltage level 311, switch node 105, and to logic circuit 501 via node 508. In various embodiments, comparator circuit 512 may be a particular embodiment of a differential amplifier configured to generate peak detection signal 509 on node 508.

The value of peak detection signal 509 is based on a comparison of reference voltage level 511 and the voltage level of switch node 105.

Rising ramp circuit 503 is coupled to control signals 303, switch node 105 and comparator circuit 502 via node 505, and is configured to generate rising ramp signal 514 on node 505. As described below in more detail, rising ramp circuit 503 may, in various embodiments, include one or more current sources configured to source current to a capacitor in order to generate rising ramp signal 514. In some embodiments, rising ramp circuit 503 may be configured to pre-charge the capacitor to a voltage level of switch node 105 to provide an initial voltage level of rising ramp signal 514.

Falling ramp circuit 504 is coupled to control signals 303, input power supply node 112 and comparator circuit 502 via node 506, and is configured to generate falling ramp signal 515 on node 506. As described below in more detail, falling ramp circuit 504 may include one or more current sources configured to sink current from a previously charged capacitor in order to generate falling ramp signal 515. In some embodiments, falling ramp circuit 504 may be configured to pre-charge the capacitor to a voltage level of input power supply node 112 to provide an initial voltage level for falling ramp signal 515.

Comparator circuit 502 is coupled to rising ramp circuit 503 and falling ramp circuit 504 via nodes 505 and 506, respectively. Comparator circuit 502 is further coupled to logic circuit 501 via node 513. In various embodiments, comparator circuit 502 may be a particular embodiment of a differential amplifier configured to amplify a difference in respective voltage levels of rising ramp signal 514 and falling ramp signal 515 to generate a reset signal 510 on node 513. In some cases, reset signal 510 is activated in response to a determination that the respective voltage levels of rising ramp signal 514 and falling ramp signal 515 are substantially the same.

Logic circuit 501 may be a particular embodiment of a sequential logic circuit or state machine configured to generate control signals 303 using reference clock signal 106, peak detection signal 509, and reset signal 510. In response to receiving peak detection signal 509, logic circuit 501 may activate one or more of control signals 303 to start a discharge cycle, as well as enable falling ramp circuit 504 to generate falling ramp signal 515. Additionally, logic circuit 501 may be configured, in response to an activation of reference clock signal 106, to activate a different set of control signals 303 to enable rising ramp circuit 503 to generate rising ramp signal 514. As used herein, activation (also referred to herein as assertion) of a signal refers to transitioning the signal to a logic value that enables a particular circuit or action coupled to the signal. In various embodiments, activation of a signal can be transition of the signal to a high or logical-1 value. In such cases, the signal is referred to as being "active high." Alternatively, activation of a signal can be a transition of the signal to a low or logical-0 value (referred to as being "active low").

Figure 6:
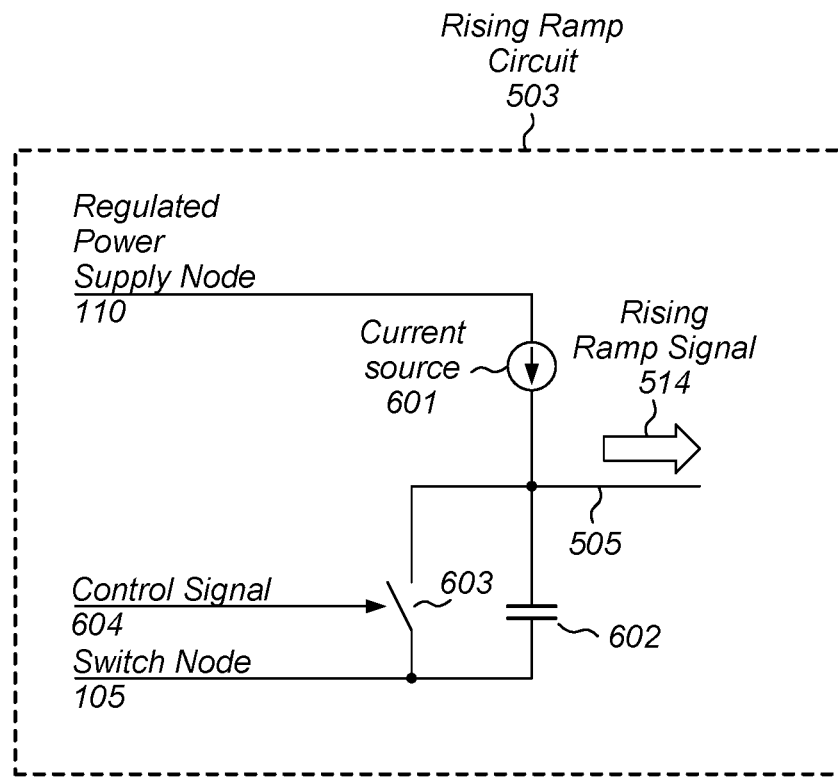
FIG. 6 illustrates a block diagram of an embodiment of a rising ramp generation circuit.

Turning to FIG. 6, a block diagram of an embodiment of rising ramp circuit 503 is depicted. As illustrated, rising ramp circuit 503 includes current source 601, capacitor 602, and switch 603.

Current source 601 is coupled between regulated power supply node 110 and rising ramp signal 514, and is configured to source a current to rising ramp signal 514 and capacitor 602. In various embodiments, a value of the current generated by current source 601 may be proportional a voltage level of regulated power supply node 110 and a voltage level of input power supply node 112.

Current source 601 may be a particular embodiment of transconductance device (e.g., a p-channel MOSFET) whose control voltage is selected to provide a desired current value. In some cases, current source 601 may be included as part of a current mirror or other suitable circuit configured to generate a particular current value.

Capacitor 602 is coupled between rising ramp signal 514 and switch node 105. When switch 603 is closed, capacitor 602 is charged to the voltage level of switch node 105. When switch 603 is open, the voltage level across capacitor 602, and therefore the voltage level of rising ramp signal 514, increases as current source 601 supplies charge to capacitor 602. In various embodiments, capacitor 602 may be fabricated using a metal-oxide-metal structure, or any other suitable structure available on a semiconductor manufacturing process using to fabricate power converter circuit 100.

Switch 603 is configured to couple, based on a value of control signal 604, a rising ramp signal 514 to switch node 105. In various embodiments, control signal 604 may be included in control signals 303 as illustrated in FIG. 3. Switch 603 may be a particular embodiment of a transmission gate or other suitable switch circuit element. In some cases, switch 603 may include one or more MOSFETs or other suitable transconductance devices. Although FIG. 6 depicts a single control signal, i.e., control signal 604, as controlling switch 603, in other embodiments, more than one control signal may be employed.

Figure 7:
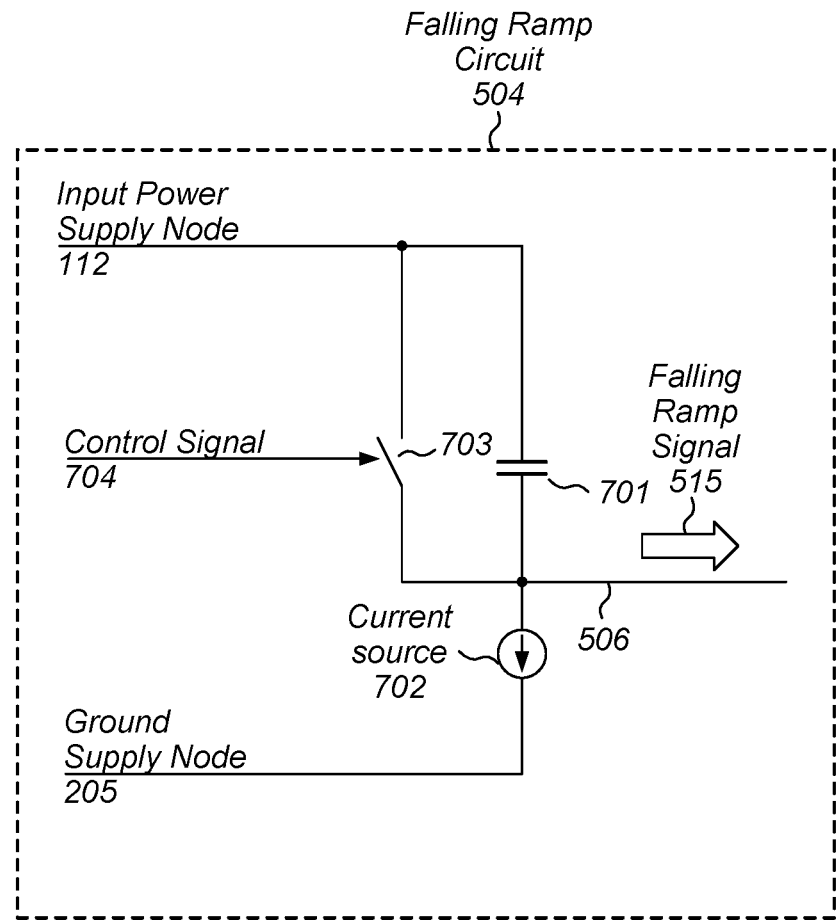
FIG. 7 illustrates a block diagram of an embodiment of a falling ramp generation circuit.

Turning to FIG. 7, a block diagram illustrating an embodiment of falling ramp circuit 504 is depicted. As illustrated, falling ramp circuit 504 includes capacitor 701, current source 702, and switch 703.

Capacitor 701 is coupled between input power supply node 112 and falling ramp signal 515 on node 506. When switch 703 is closed, falling ramp signal 515 is set to the same voltage level as the voltage level of input power supply node 112, and capacitor 701 is charged to the voltage level of input power supply node 112. When switch 703 is open, capacitor 701 is discharged by current source 702, generating a decreasing voltage level on falling ramp signal 515. In various embodiments, capacitor 701 may be fabricated using a metal-oxide-metal structure, or any other suitable structure available on a semiconductor manufacturing process used to fabricate power converter circuit 100 (e.g., as shown in FIG. 1).

Current source 702 may be a particular embodiment of transconductance device (e.g., a n-channel MOSFET) whose control voltage is selected to provide a desired current value. In some cases, current source 702 may be included as part of a current mirror or other suitable circuit configured to generate a particular current value.

Switch 703 is configured to couple, based on a value of control signal 704, a falling ramp signal 515 to input power supply node 112. In various embodiments, control signal 704 may be included in control signals 303 as illustrated in FIG. 3. Switch 703 may be a particular embodiment of a transmission gate or other suitable switch circuit element. In some cases, switch 703 may include one or more MOSFETs or other suitable transconductance devices. Although FIG. 7 depicts a single control signal, i.e., control signal 704, as controlling switch 703, in other embodiments, more than one control signal may be employed.

Figure 8:
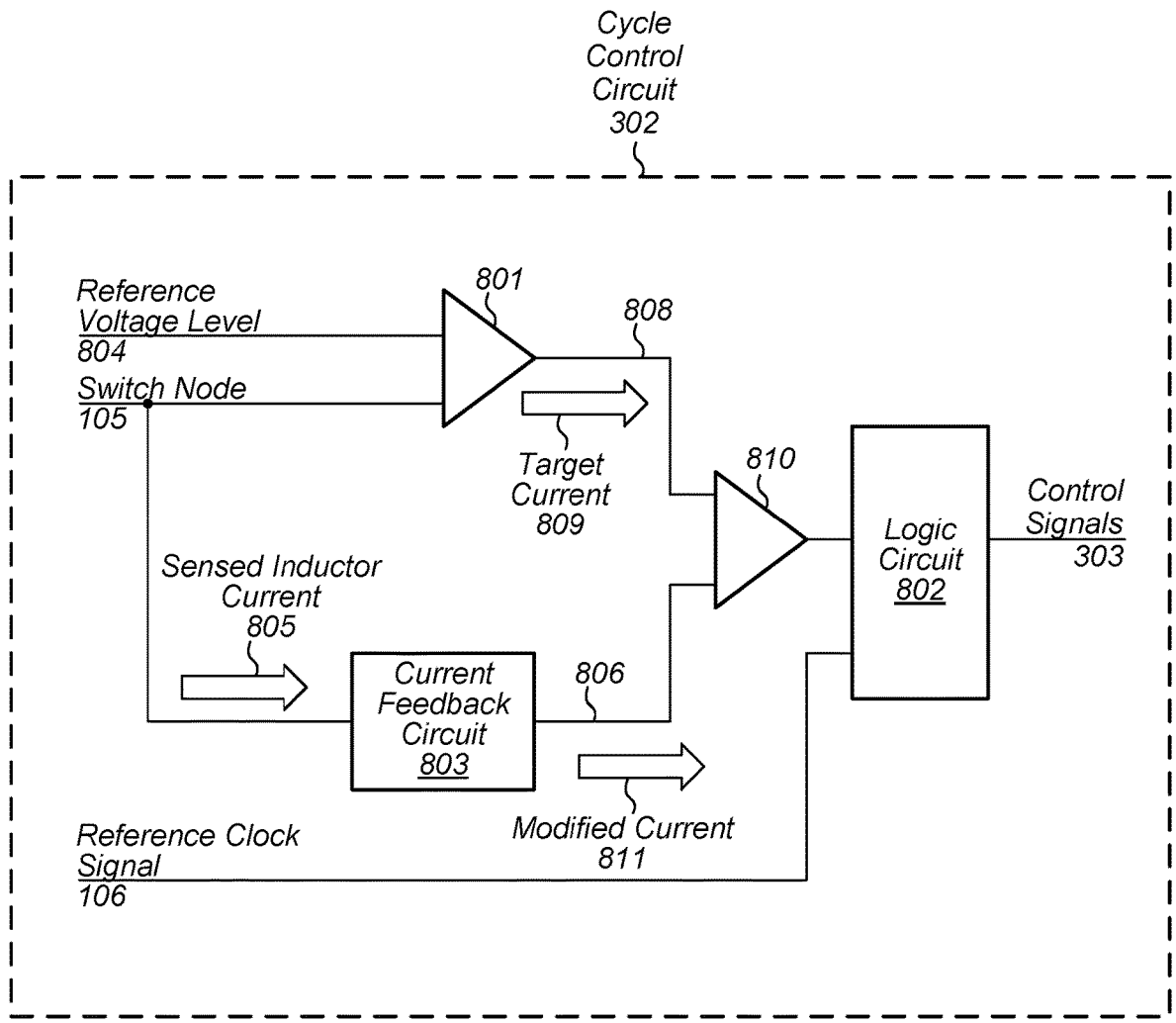
FIG. 8 is a block diagram of another embodiment of cycle control circuit.

As mentioned above, cycle control circuit 302 is configured to initiate and halt a charge cycle using generated ramp signals. In other embodiments, different control mechanisms may be used to determine the duration of a charge or a discharge cycle. Another embodiment of cycle control circuit 302 is depicted in FIG. 8. As illustrated, cycle control circuit 302 includes error amplifier 801, logic circuit 802, current feedback circuit 803, and comparator 810.

Error amplifier 801 may be a particular embodiment of a differential amplifier configured to generate a target current 809 in node 808. In various embodiments, a value of target current 809 may be proportional to the difference between reference voltage level 804 and a voltage level of switch node 105.

Comparator 810 is coupled to error amplifier 801 via node 808 and current feedback circuit 803 via node 806. Comparator 810 may be also be a particular embodiment of a differential amplifier configured to generate an output voltage based on a comparison of target current 809 and modified current 811 generated by current feedback circuit 803. In various embodiments, when modified current 811 is within a threshold value of target current 809, comparator 810 may generate a voltage level at its output that is used by logic circuit 802 to determine a duration of a charge or a discharge cycle.

Logic circuit 802 may be a particular embodiment of a state machine or sequential logic circuit that is configured to generate control signals 303. In various embodiments, logic circuit 802 may include a latch or flip-flop circuit. Prior to the start of the charge cycle, the latch or flip-flop circuit may be in a reset state. Upon an assertion of reference clock signal 106, the latch or flip-flop circuit may be set, allowing the assertion of particular ones of control signals 303. In some embodiments, the assertion of the particular ones of control signals 303 after the latch or flip-flop circuit has been set may be based, at least in part, on reference clock signal 106.

In addition to initiating the charge cycle, logic circuit 802 is also configured to determine a duration of the charge cycle, and when the determined duration has elapsed, halt the charge cycle. In various embodiments, logic circuit 802 may be configured to use the output of comparator 810 to determine the duration of the charge cycle. When the determined duration of the charge cycle has elapsed, logic circuit 802 may reset the latch or flip-flop circuit, preparing for a subsequent charge cycle.

Logic circuit 802 may be a particular embodiment of a sequential logic circuit or state machine configured to transition between multiple logical states based on the voltage levels of nodes 808 and 806, as well as the respective states of reference clock signal 106.

The use of switch node 105 and sensed inductor current 805 as part of the information used to determine the duration of a charge cycle, forms a control loop similar to those found in phase-locked loops. Such circuit topologies may introduce another pole into the overall power converter circuit, which may present problems with stability of control loops of such power converter circuits. One technique to compensate for additional poles, involves the introduction of a zero into the transfer function of the control loop of a power converter circuit such as power converter circuit 100.

As described below in more detail, current feedback circuit 803 is configured to introduce a zero into the transfer function of the control loop of power converter circuit 100 (e.g., as shown in FIG. 1). In some cases, current feedback circuit 803 may be configured to modify a value of sensed inductor current 805 to generate modified current 811. In various embodiments, current feedback circuit 830 is configured to introduce a step in sensed inductor current 805. The value of the step may be proportional to the duration of the charge cycle. By generating the modified current 811 in this fashion, the stability of the control loop of power converter circuit 100 may be improved.

Figure 9:
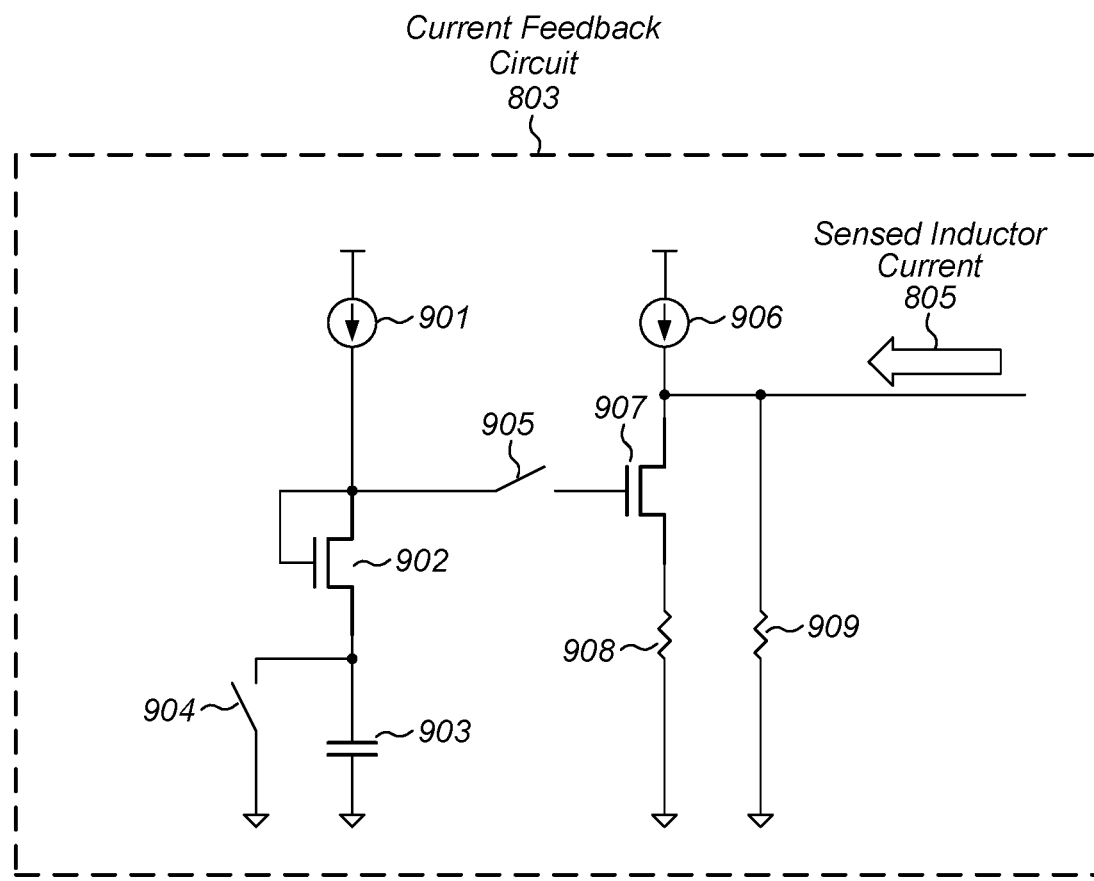
FIG. 9 is a block diagram of an embodiment of a current feedback circuit.

Turning to FIG. 9, an embodiment of current feedback circuit 803 is depicted. As illustrated, current feedback circuit 803 includes devices 902 and 907, switches 904 and 905, current sources 901 and 906, resistors 908 and 909, and capacitor 903.

Current source 901 is configured to source a current to device 902. The value of the current sourced by current source 901 is proportional to a voltage level of an input power supply to power converter circuit 100. In various embodiments, current source 901 may a particular embodiment of a p-channel MOSFET whose control terminal is connected to a circuit node at a particular voltage level so as to bias or activate the p-channel MOSFET to provide a current proportional to the input power supply.

Both the control terminal and the drain terminal of device 902 are coupled to current source 901 and switch 905. The source terminal of device 902 is coupled to switch 904 and capacitor 903. In various embodiments, device 902 is configured to provide a threshold voltage shift on the control terminal of device 907 to compensate for the threshold voltage of device 907.

Capacitor 903 is coupled to device 902 and switch 904, and may be a particular embodiment of a metal-oxide-metal (MOM), or similar structure available on a semiconductor manufacturing process. In various embodiments, current from current source 901 may charge capacitor 903, when switch 904 is open during the charge cycle, to a voltage level proportional to the duration of the charge cycle. When the charge cycle ends, the voltage level across capacitor 903 is proportional to the duration of the charge cycle. Prior to the start of a next charge cycle, switch 904 may close, resetting the voltage across capacitor 903 to a voltage level at or near ground potential.

Device 902 and current source 901 are coupled to device 907 when switch 905 is closed during the charge cycle. During the off time of power converter circuit 100, the voltage across capacitor 903 is coupled to the control terminal of device 907, which acts as a voltage-to-current converter, discharging a current through resistor 908 to ground. The current discharged by device 907 is subtracted from sensed inductor current 805, which results in an offset in the current proportional to the duration of the charge cycle in the modified version of sensed inductor current 805. The offset in modified version of sensed inductor current 805 acts as a zero in the control loop of power converter circuit 100, thereby improving the stability of the control loop.

Resistor 909 and current source 906 may be configured to provide a desired DC operating point for current feedback circuit 803. Current source 906 may, in various embodiments, be a particular embodiment of a MOSFET whose control terminal is coupled to a node at a particular voltage level in order to provide a current proportional to a voltage level of regulated power supply node 110 (e.g., as described above with respect to FIG. 1 and FIG. 2). In various embodiments, resistors 908 and 909 may be constructed using metal, polysilicon, or any other suitable material available on a semiconductor manufacturing process.

Switches 904 and 905 may be particular embodiments of devices such as MOSFET. In some cases, switches 904 and 905 may be individual MOSFETs or they may be complementary pass gates employing both p-channel and n-channel MOSFETs.

Structures such as those shown in FIGS. 2-9 for generating a regulated power supply signal may be referred to using functional language. In some embodiments, these structures may be described as including "a means for sourcing a charge current to the switch node during a charge cycle," "a means for generating a reference clock signal using a system clock signal and a voltage level of the switch node," "a means for generating a plurality of ramp signals using the voltage level of the switch node," "a means for initiating the charge cycle using the reference clock signal," and "a means for halting the charge cycle using the plurality ramp signals."

The corresponding structure for "means for sourcing a charge current to the switch node during a charge cycle" is device 201 and its equivalents. The corresponding structure for "means for generating a reference clock signal using a system clock signal and a voltage level of the switch node" is clock generation circuit 301 and other equivalent circuits. The corresponding structure for "means for generating a plurality of ramp signals using the voltage level of the switch node" is rising ramp circuit 503 and falling ramp circuit 504, and their equivalents. Logic circuit 501 and its equivalents are the corresponding structure for "means for initiating the charge cycle using the reference clock signal." The corresponding structure for "means for halting the charge cycle using results the plurality of ramp signals" is comparator 502 and logic circuit 501, and their equivalents.

Figure 10:
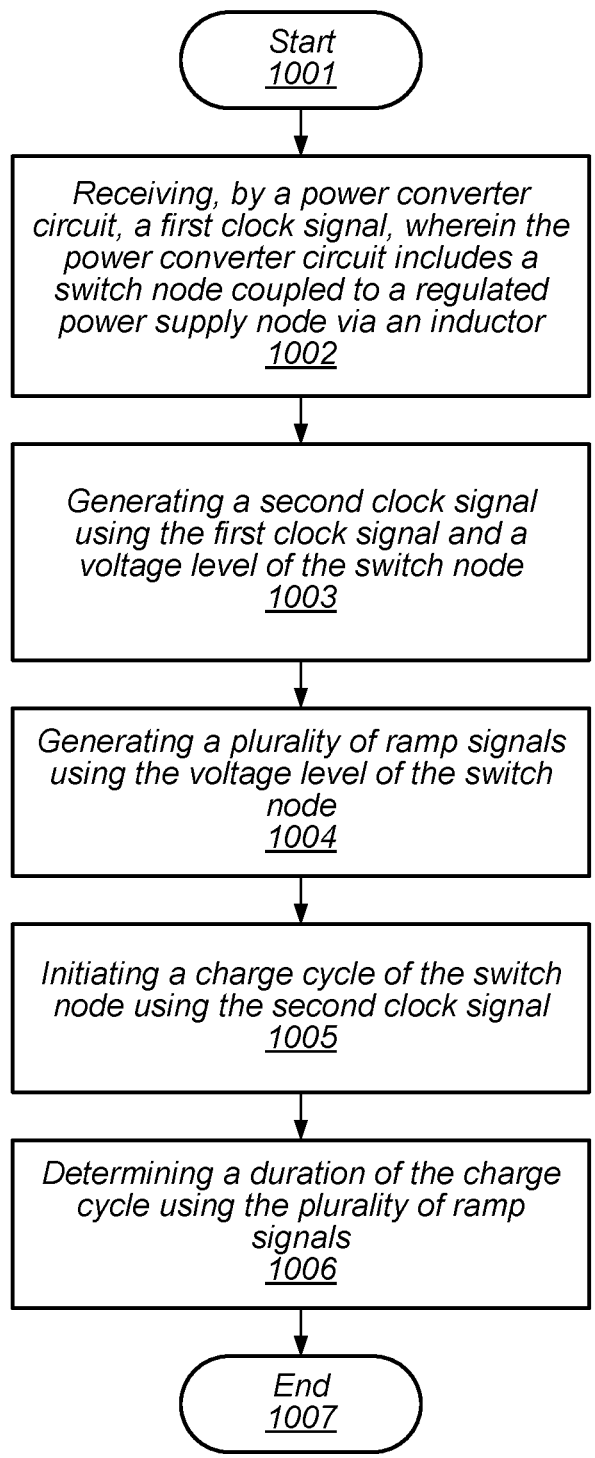
FIG. 10 depicts a flow diagram illustrating an embodiment of a method for operating a power converter circuit.

Turning to FIG. 10, a flow diagram depicting an embodiment of a method for operating a power converter circuit is illustrated. The method, which begins in block 1001, may be applied to various power converter circuits, such as power converter circuit 100 as illustrated in FIG. 1.

The method includes receiving, by a power converter circuit, a first clock signal, wherein the power converter circuit includes a switch node coupled to a regulated power supply node via an inductor (block 1002). In various embodiments, the method may include generating the first clock signal using a phase-locked loop (PLL). It is noted that a frequency of the first clock signal may be any suitable value that can be used to operate the power converter circuit.

The method further includes generating a second clock signal using the first clock signal and a voltage level of the switch node (block 1003). In various embodiments, the method may also include determining a phase difference between the first clock signal and the voltage level of the switch node. The method may, in other embodiments, include generating a control voltage level the phase difference.

In various embodiments, the method may include generating a control current using the control voltage. The method may also include, in some cases, delaying, by a period of time, the first clock signal to generate the signal clock signal. The period of time may be based, at least in part, on a value of the control current. In some cases, a frequency of the first clock signal may be the same as a frequency of the second clock signal.

Additionally, the method includes generating a plurality of ramp signals using the voltage level of the switch node (block 1004). In various embodiments, the method may include generating a first current whose value is proportional to the voltage level of the regulated power supply node and discharging a first capacitor using the first current, to generate the falling ramp signal, where the first capacitor is coupled between a first terminal of the comparator circuit and an input power supply node to generate the falling ramp signal.

The method may also include, in some embodiments, generating a second current whose value is proportional to a difference between a voltage level of an input power supply node and a voltage level of the regulated power supply node, and charging a second capacitor using the second current to generate the rising ramp signal. The second capacitor is coupled between a second terminal of the comparator circuit and the switch node.

The method also includes initiating a charge cycle of the switch node using the second clock signal (block 1005). In various embodiments, the method may include setting a latch circuit using the second signal as part of initiating the charge cycle. The method may, in some embodiments, include, in response to initiating the charge cycle, souring a charge current to the switch node. In some cases, the method may include activating a device coupled between the switch node and an input power supply node, in response to initiating the charge cycle.

The method further includes determining a duration of the charge cycle using the plurality of ramp signals (block 1006). Although the embodiment of the method depicted in FIG. 10 specifies initiating and halting a charge cycle of voltage regulator circuit 102, in other embodiments, the reference clock signal may be used to initiate a discharge cycle of voltage regulator circuit 102, and the plurality of ramp signals may be used to determine a duration of the discharge cycle. The method concludes in block 1007.

Figure 11:
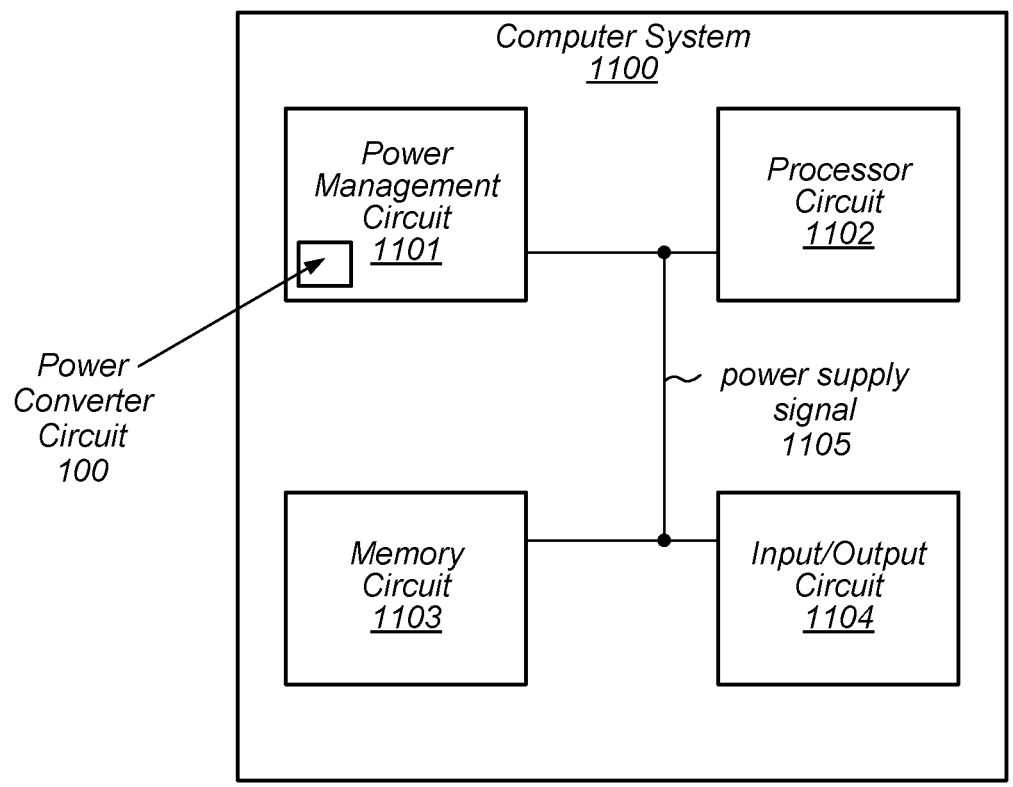
FIG. 11 illustrates a block diagram of a computer system.

A block diagram of computer system is illustrated in FIG. 11. In the illustrated embodiment, the computer system 1100 includes power management unit 1101, processor circuit 1102, memory circuit 1103, and input/output circuits 1104, each of which is coupled to power supply signal 1105. In various embodiments, computer system 1100 may be a system-on-a-chip (SoC) and/or be configured for use in a desktop computer, server, or in a mobile computing application such as, e.g., a tablet, laptop computer, or wearable computing device.

Power management unit 1101 includes power converter circuit 100 which is configured to generate a regulated voltage level on power supply signal 1105 in order to provide power to processor circuit 1102, memory circuit 1103, and input/output circuits 1104. Although power management unit 1101 is depicted as including a single power converter circuit, in other embodiments, any suitable number of power converter circuits may be included in power management unit 1101, each configured to generate a regulated voltage level on a respective one of multiple internal power supply signals included in computer system 1100. In cases where multiple power converter circuits are employed, two or more of the multiple power converter circuits may be connected to a common set of power terminals that connections to power supply signals and ground supply signals of computer system 1100.

Processor circuit 1102 may, in various embodiments, be representative of a general-purpose processor that performs computational operations. For example, processor circuit 1102 may be a central processing unit (CPU) such as a microprocessor, a microcontroller, an application-specific integrated circuit (ASIC), or a field-programmable gate array (FPGA).

Memory circuit 1103 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 11, in other embodiments, any suitable number of memory circuits may be employed.

Input/output circuits 1104 may be configured to coordinate data transfer between computer system 1100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1104 may be configured to implement a version of Universal Serial Bus (USB) protocol or IEEE 1394 (Firewire®) protocol.

Input/output circuits 1104 may also be configured to coordinate data transfer between computer system 1100 and one or more devices (e.g., other computing systems or integrated circuits) coupled to computer system 1100 via a network. In one embodiment, input/output circuits 1104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1104 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a voltage regulator circuit that includes a switch node coupled to a regulated power supply node via an inductor, wherein the voltage regulator circuit is configured to source a charge current to the switch node during a charge cycle; and
    a control circuit configured to:
        determine a phase difference between a system clock signal and a voltage level of the switch node;
        generate a reference clock signal using the phase difference;
        generate a plurality of ramp signals using the voltage level of the switch node;
        initiate the charge cycle using the reference clock signal; and
        halt the charge cycle using the plurality of ramp signals.

2. The apparatus of claim 1, wherein to generate the reference clock signal, the control circuit is further configured, based on the phase difference, to selectively charge or discharge a capacitor.

3. The apparatus of claim 2, wherein the control circuit is further configured to generate a control current using a voltage level across the capacitor.

4. The apparatus of claim 3, wherein the control circuit is further configured to delay the system clock signal to generate the reference clock signal.

5. The apparatus of claim 1, wherein the control circuit is further configured to halt the charge cycle using a result of a comparison of a voltage level of the switch node and a reference voltage level.

6. A method, comprising:
    receiving, by a power converter circuit, a system clock signal, wherein the power converter circuit includes a switch node coupled to a regulated power supply node via an inductor, and a control circuit;
    determining, by the control circuit, a phase difference between the system clock signal and a voltage level of the switch node;
    generating a reference clock signal using the phase difference;
    generating, by the control circuit, a plurality of ramp signals using the voltage level of the switch node;
    initiating, by the control circuit, a charge cycle of the switch node using the reference clock signal; and
    halting, by the control circuit, the charge cycle using the plurality of ramp signals.

7. The method of claim 6, further comprising generating, by the control circuit, a control voltage using the phase difference.

8. The method of claim 7, further comprising:
    generating a control current using the control voltage; and
    delaying, by a period of time, the system clock signal to generate the reference clock signal, wherein the period of time is based, at least in part, on a value of the control current.

9. The method of claim 6, wherein a first frequency of the system clock signal is the same as a second frequency of the reference clock signal.

10. The method of claim 6, further comprising, generating a rising ramp signal using the reference clock signal and generating a falling ramp signal using a voltage level of an input power supply node.

11. The method of claim 6, wherein halting the charge cycle includes determining a duration of the charge cycle using the plurality of ramp signals.

12. An apparatus, comprising:
    a voltage regulator circuit including a switch node coupled to a regulated power supply node via an inductor, wherein the voltage regulator circuit is configured to source a charge current to the switch node, in response to an activation of a control signal;
    a clock generation circuit configured to:
        determine a phase difference between a system clock signal and a voltage level of the switch node;
        generate a reference clock signal using the phase difference; and
        generate a plurality of ramp signals using the voltage level of the switch node; and
    a cycle control circuit configured to generate the control signal using the reference clock signal.

13. The apparatus of claim 12, wherein the clock generation circuit further includes:
    a phase detector circuit configured to generate a first signal using the system clock signal and the voltage level of the switch node;
    a capacitor; and
    a first switch coupled between a first current source and the capacitor, wherein the first switch is configured to couple the capacitor to the first current source using the first signal generated by the phase detector circuit; and a second switch coupled between a second current source and the capacitor, wherein the second switch is configured to couple the capacitor to the second current source using a second signal generated by the phase detector circuit.

14. The apparatus of claim 13, further comprising a device configured to generate a control current using a voltage level across the capacitor.

15. The apparatus of claim 14, wherein the clock generation circuit further includes a delay circuit configured to generate the reference clock signal by delaying the system clock signal by a particular amount of time that is based on a value of the control current.

16. The apparatus of claim 12, wherein the cycle control circuit is further configured to activate the control signal in response to an assertion of the reference clock signal.

17. The apparatus of claim 16, wherein the cycle control circuit is further configured to deactivate the control signal using the plurality of ramp signals.

* * * * *